Figure 1:
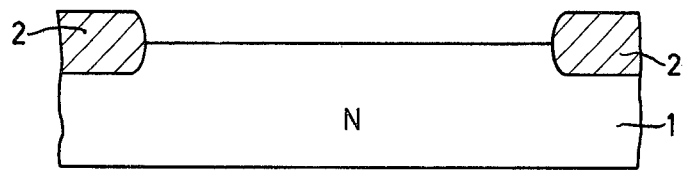

United States Patent [19]

Sanders et al.

[11] 4,381,967

[45] May 3, 1983

[54] METHOD OF MANUFACTURING A SEMICONDUCTOR DEVICE

[75] Inventors: Franciscus H. M. Sanders, Eindhoven, Netherlands; Jozef A. M. Sanders, Sunnyvale, Calif.; Jan Dieleman, Eindhoven, Netherlands

[73] Assignee: U.S. Philips Corporation, New York, N.Y.

[21] Appl. No.: 281,758

[22] Filed: Jul. 9, 1981

[30] Foreign Application Priority Data

Jul. 11, 1980 [NL] Netherlands ........................ 8004007

[51] Int. Cl.³ ...................... H01L 21/306; C23F 1/02
[52] U.S. Cl. .................................... 156/643; 156/646; 156/656; 156/657; 156/659.1; 204/192 E; 252/79.1
[58] Field of Search ............ 156/643, 646, 657, 659.1, 156/662, 656; 252/79.1; 204/164, 192 E, 298; 427/38, 39, 88; 430/313, 318

[56] References Cited

U.S. PATENT DOCUMENTS 4,260,649  4/1981  Denison et al. ................. 156/643 X

FOREIGN PATENT DOCUMENTS 138850   11/1979  Fed. Rep. of Germany ...... 156/646
51-22637  2/1976  Japan ................................. 156/643
53-14571  2/1978  Japan .
54-97373  8/1979  Japan ................................. 156/643

Primary Examiner—William A. Powell
Attorney, Agent, or Firm—Paul R. Miller

[57] ABSTRACT

A method of manufacturing a semiconductor device where a layer which is present on a substrate and which is locally covered with an organic lacquer layer is etched by bringing the layer into contact with constituents of a plasma which is formed in a gas mixture containing a halogen compound and an oxygen compound. The rate at which the organic lacquer layer is removed by the constituents of the plasma is substantially reduced by the addition of from 1 to 15% by vol. of CO to this gas mixture.

7 Claims, 8 Drawing Figures

METHOD OF MANUFACTURING A SEMICONDUCTOR DEVICE

The invention relates to a method of manufacturing a semiconductor device where a layer which is present on a substrate and which is locally covered with an organic lacquer layer is etched by bringing the layer into contact with constituents of a plasma formed in a gas mixture containing a halogen compound and an oxygen compound. The layer can be brought into contact with only electrically non-charged constituents of the plasma, like for example, in customary tunnel reactors, but also with a mixture of electrically charged and non-charged constituents of the plasma, like for example, in customary planar reactors.

A method of this kind is particularly suitable, for example, for manufacturing semiconductor devices in which, in order to form electrically conductive tracks on a substrate, the entire substrate is covered with a conductive layer of metal or poly Si having portions covered with a layer of organic lacquer. Non-covered portions can subsequently be removed by means of the described method, after which the remaining portions of the conductive layer form the desired conductive tracks. In order to enable a fine pattern of conductive tracks to be realized in practice, it is inter alia very important that the conductive layer is uniformly etched away, measured across the substrate, and that the layer of organic lacquer is not excessively attacked.

Japanese Patent Specification KOKAI No. 53-14571 discloses a method of the kind set forth where the layer which is present on a substrate and which is locally covered with a layer of organic lacquer is etched by bringing the layer into contact with constituents of a plasma formed in a gas mixture containing $CF_4$ as the halogen compound and $CO_2$ as the oxygen compound.

It is a drawback of the known method that, in order to enable sufficiently uniform etching away of a conductive layer of metal or poly Si, the $SF_4/CO_2$ gas mixture in which the plasma is formed must contain a comparatively large quantity of $CO_2$. Consequently, a layer of organic lacquer which locally covers the conductive layer is comparatively strongly attacked by the constituents of the plasma. Therefore, use must be made of a comparatively thick lacquer layer, and hence a comparatively coarse pattern of conductive tracks will be obtained.

It is an object of the invention to mitigate these drawbacks. To this end, a method of the described kind in accordance with the invention is characterized in that from 1 to 15% by vol. of CO is added to the gas mixture. By the addition of only a small quantity of CO to the gas mixture in which the plasma is formed, the rate and the uniformity with which the conductive layer is removed by the constituents of the plasma are not adversely influenced, while the etching rate at which the organic lacquer is removed is reduced by approximately a factor of ten. As a result, the organic lacquer layer may be comparatively thin, so that a comparatively fine pattern of conductive tracks can be realized.

In a preferred embodiment of the method in accordance with the invention, the gas mixture in which the plasma is formed contains, besides the addition of CO, $CF_4$ as the halogen compound and a compound from the group $O_2$, $CO_2$ and NO as the oxygen compound. Poly Si can then be removed approximately fifty times faster than organic lacquer while, measured across a substrate of approximately 100 $cm^2$, no differences in excess of approximately 10% of the largest etching rate measured on the surface occur. The addition of NO as the oxygen compound, moreover, offers the advantage that addition of air, of up to approximately 2.5% by vol. does not have an adverse effect on the differences in the etching rate measured across the substrate surface. This is contrary to plasmas formed in mixtures wherein $CO_2$ is added as the oxygen compound. As a result, this mixture can be comparatively easily used, even with equipment which is not completely free from leaks.

The invention will be described in detail herein, after, by way of example, with reference to the drawing and some embodiments.

Figure 6:
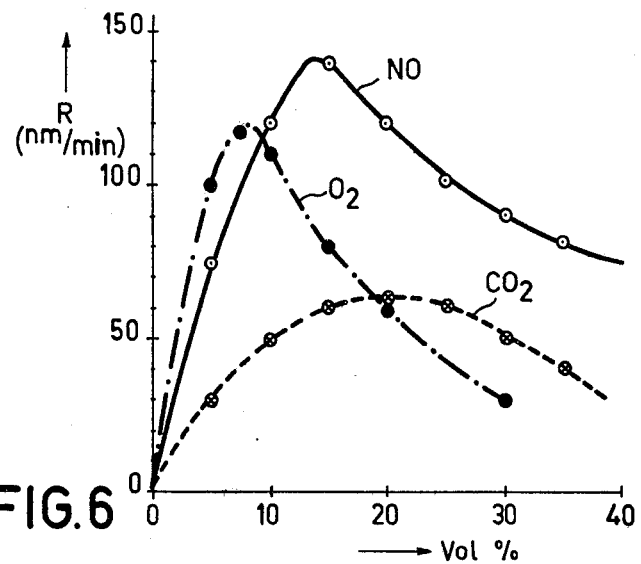
Figure 7:
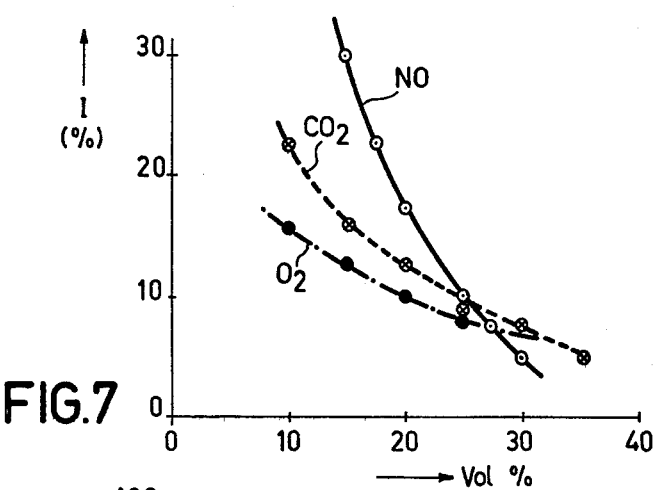
Figure 8:
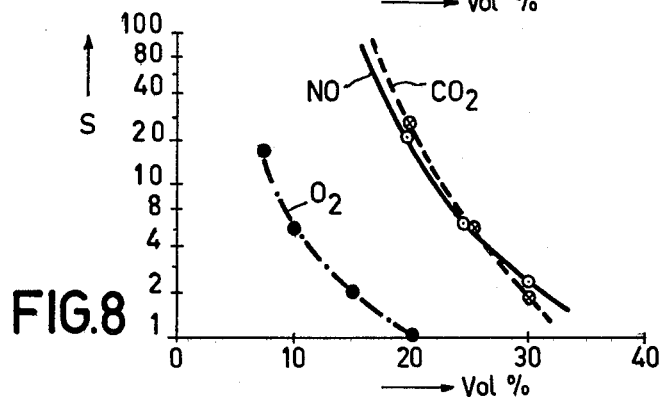

FIGS. 1 to 5 are diagrammatic cross-sectional views of successive stages of manufacture of a part of a semiconductor device, using the method in accordance with the invention, FIG. 6 shows etching rates of poly Si, FIG. 7 shows differences in etching rates of poly Si measured across the substrate, and FIG. 8 shows ratios of etching rates of poly Si and photolacquer obtained during etching by means of constituents of plasmas formed in $CF_4/O_2$, $CF_4/NO$ and, for the purpose of comparison, in $CF_4/CO_2$ mixtures with variable quantities of $O_2$, NO and $CO_2$, respectively.

The FIGS. 1 to 5 diagrammatically show successive stages of manufacture of a field effect transistor for which a starting material is used in the form of an N-type Si substrate 1 which is divided into mutually insulated fields in a customary manner by means of $SiO_2$ regions 2 having a thickness of approximately 1000 nm which are also referred to as field oxide (FIG. 1). For the sake of clarity, only one such field is shown, but in practice an Si substrate will comprise a large number of such fields.

Figure 2:
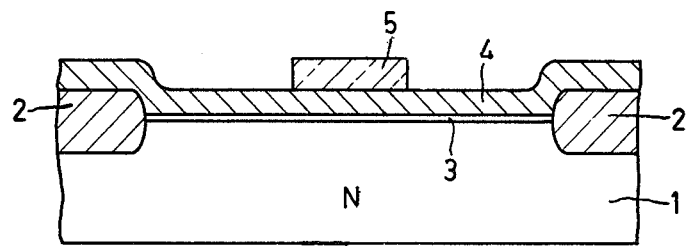
Figure 3:
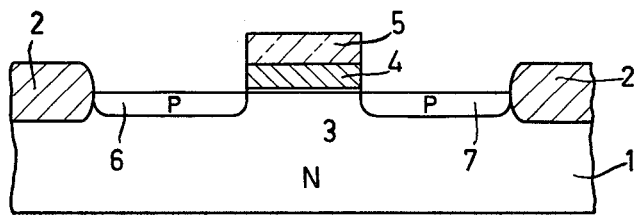

After the formation of the field oxide 2, the Si substrate 1 is provided with a thin layer of so-called gate oxide 3 having a thickness of approximately 10 nm, and the assembly is covered with a layer 4 of metal or poly Si and a layer 5 of organic lacquer in order to form a conductive track which serves as a gate electrode. The lacquer layer 5 also serves to define the location of the gate of the field effect transistor (FIG. 2).

Subsequently, the portions of the layer 4 of poly Si which are not covered by the lacquer layer are removed by means of a method to be described hereinafter. After the portions of the $SiO_2$ layer 3 thus uncovered have also been removed in a customary manner, P-type Si regions 6 and 7 which will later serve as source and drain of the transistor are then formed in the portions of the Si substrate 1 thus uncovered in a customary manner by P-ion implantation.

Figure 4:
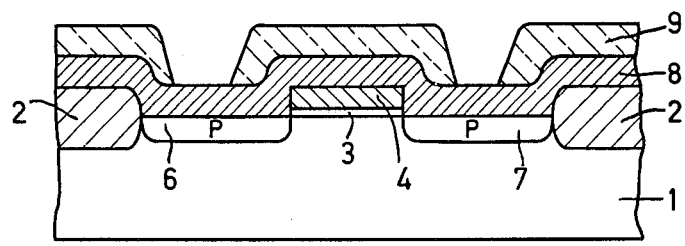
Figure 5:
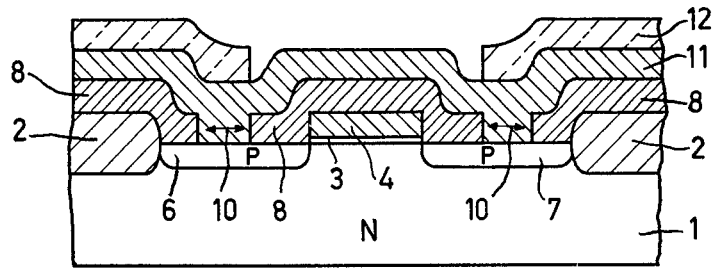

After the removal of the lacquer layer 5, the assembly is covered in a customary manner with an insulating layer 8 of $SiO_2$ in which windows 10 for the contacting of the P-type Si-regions 6 and 7 are formed in a customary manner by means of a masking layer 9 of photolacquer (FIG. 4).

After the formation of the windows 10, the masking layer 9 is removed in a customary manner and the assembly is again completely covered with a conductive layer 11 of metal or poly Si in order to form conductive tracks which serve as source and drain electrodes. Portions of the layer are covered in a customary manner by means of a layer 12 of organic lacquer, after which the non-covered portions are also removed by means of the method yet to be described.

For the formation of the electrically conductive tracks, the conductive layers 4 and 11 which are present on the Si substrate 1 and which are locally covered by a layer 5 and 12 of organic lacquer are etched away by bringing the layers 4 and 11 into contact with constituents of a plasma formed in a gas mixture containing a halogen compound and an oxygen compound. In accordance with the invention, from 1 to 15% by vol. of CO are added to the gas mixture. This addition hardly influences the rate and the uniformity with which the conductive layer 4 or 11 is removed, while the rate at which the layer 5 or 12 of organic lacquer is removed is reduced by approximately a factor of ten. As a result, the lacquer layer 5 or 12 may be comparatively thin, so that a comparatively fine pattern of conductive tracks can be realized.

For the embodiments to be described hereinafter, Si discs having a diameter of approximately 100 mm and covered with layers of Mo or poly Si on a layer of $SiO_2$ and with a layer thickness of from 250 to 500 nm were etched in a plasma etching reactor. Portions which were not to be etched were masked by means of a layer or organic lacquer having a thickness of from 1000 to 1500 nm. At a substrate temperature of approximately 125° C., the discs thus treated were brought into contact with an etching plasma generated in the reactor at a frequency of 13.56 MHz, a power of approximately 150 W and a gas flow rate of from 100 to 300 SCC/min.

EXAMPLE I

FIG. 6 shows the etching rate R in nm/min at which poly Si is etched away with non-charged constituents of a plasma formed in gas mixtures of $CF_4$ and $O_2$, of $CF_4$ and NO, with a total pressure of approximately 50 Pa and, for the purpose of comparison, in gas mixtures of $CF_4$ and $CO_2$ with a total pressure of approximately 50 Pa as a function of the quantity in vol. % of $O_2$, NO and $CO_2$, respectively, added to the gas mixture. The tests were performed in the so-called "afterglow" of these plasmas in a tunnel reactor.

FIG. 7 shows the maximum differences in the etching rate, measured across the Si-chip and expressed in % of the maximum etching rate measured on the Si-chip, the so-called "inhomogeneity" I during etching with non-charged constituents of plasma formed in gas mixtures of $CF_4$ and $O_2$, of $CF_4$ and NO and, for the purpose of comparison, in gas mixtures of $CF_4$ and $CO_2$ as a function of the quantity in % by volume of $O_2$, NO and $CO_2$, respectively, added to the gas mixture.

FIG. 8 shows the ratio of the etching rates of poly-Si and organic lacquer, the so-called "selectivity" S during etching with non-charged constituents of plasmas formed in gas mixtures of $CF_4$ and $O_2$, of $CF_4$ and NO and, for the purpose of comparison, in gas mixtures of $CF_4$ and $CO_2$ as a function of the quantity in % by volume of $O_2$, NO and $CO_2$, respectively, added to the gas mixture.

In order to enable the use of the gas mixtures in practice, the inhomogeneity I should be less than approximately 10%, which means that use is preferably made of gas mixtures whereto at least 20% by vol. of $O_2$ or at least 25% by vol. of $CO_2$ or NO is added. Particularly if $O_2$ is added to the gas mixture, the selectivity S is low in these cases, which means that the attack of the organic lacquer is comparatively high. Addition of a small quantity of CO to the gas mixture hardly changes FIGS. 6 and 7, while the scale values along the vertical axis of FIG. 8 have to be reduced by a factor 10. This is because the attack of the photolacquer has become ten times smaller. In a mixture of 65% by vol. of $CF_4$ and 35% by vol. of $CO_2$, the etching rate of poly Si amounts to 40 nm/min and that of photolacquer to 60 nm/min. In a mixture of 62% by vol. of $CF_4$, 33% by volume of $CO_2$ and 5% by vol. of CO, the etching rate of poly Si amounts to 40 nm/min and that of photolacquer to only 6 nm/min. If NO is substituted for $CO_2$ in these gas mixtures, the etching rate of poly Si amounts to 80 nm/min in both cases and that of photolacquer to 70 nm/min and 7 nm/mn, respectively. An additional advantage of $CF_4$/NO mixtures consists in that, when air up to approximately 2.5% by volume is admitted, to the gas mixture, the plasma formed in the gas mixture remains homogeneous; that is not so, for example, in $CF_4/CO_2$ mixtures. As a result, a $CF_4$/NO mixture can be comparatively easily used in practice, because a slight ingress of air into the etching ractor does not influence the etching.

EXAMPLE II

Constituents of a plasma formed in a gas mixture of $CF_4$, NO and CO which contains approximately 25% by vol. of NO and approximately 5% by vol. of CO are suitable for removing Mo at a rate of 1.75 μm/min, while organic lacquer is then removed at a rate of 10 nm/min.

EXAMPLE III

Constituents of a plasma formed in a gas mixture of $SF_6$, NO and CO which contains approximately 35% by vol. of NO and 5% by vol. of CO are suitable for removing poly Si at a rate of 100 nm/min, while no attack of organic lacquer is observed.

EXAMPLE IV

Constituents of a plasma formed in a gas mixture of $CF_3Cl$, NO and CO which contains approximately 45% by vol. of NO and approximately 5% by vol. of CO are suitable for removing poly Si at a rate of 50 nm/min, while no attack of organic lacquer is observed.

What is claimed is:

1. In a method of manufacturing a semiconductor device comprising the steps of forming a layer on a substrate, locally covering said layer with an organic lacquer layer, and plasma etching said layer, the improvement comprising forming a plasma of a gas mixture having a composition of an oxygen compound, a halogen compound, and from 1 to 15% by volume of CO.

2. A method according to claim 1, wherein said gas mixture contains $CF_4$ as said halogen compound, and a compound from the group $O_2$, $CO_2$ and NO as said oxygen compound.

3. A method according to claim 1, wherein said gas mixture contains $SF_6$ as said halogen compound, and a compound from the group $O_2$, $CO_2$ and NO as said oxygen compound.

4. A method according to one of claims 1, 2 or 3, wherein said layer is a conductive material.

5. A method according to claim 4, wherein said conductive material is one of polysilicon or metal.

6. A method according to claim 1, wherein the rate of etching said organic lacquer layer is reduced by factor of ten.

7. A method according to one of claims 1 or 6, wherein said layer is a conductive material, and wherein said organic lacquer layer is comparatively thin such that a comparatively fine pattern of conductive tracks of said layer is formed.

* * * * *